(12) United States Patent
Ogle, Jr. et al.

(10) Patent No.: US 6,512,264 B1
(45) Date of Patent: Jan. 28, 2003

(54) FLASH MEMORY HAVING PRE-INTERPOLY DIELECTRIC TREATMENT LAYER AND METHOD OF FORMING

(75) Inventors: Robert B. Ogle, Jr., San Jose, CA (US); Arvind Halliyal, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 35 days.

(21) Appl. No.: 09/594,207

(22) Filed: Jun. 14, 2000

Related U.S. Application Data
(60) Provisional application No. 60/148,899, filed on Aug. 13, 1999.

(51) Int. Cl.[7] .............................................. H01L 29/788
(52) U.S. Cl. ........................ 257/324; 257/314; 257/315
(58) Field of Search ................................. 257/316, 324, 257/325, 315, 411, 314

(56) References Cited

U.S. PATENT DOCUMENTS

| | | | |
|---|---|---|---|
| 5,705,416 A | * | 1/1998 | Kim et al. |
| 5,729,035 A | * | 3/1998 | Anma |
| 6,127,227 A | * | 10/2000 | Lin et al. |
| 6,190,969 B1 | * | 2/2001 | Lin et al. |

* cited by examiner

Primary Examiner—Nathan J. Flynn
Assistant Examiner—Kevin Quinto
(74) Attorney, Agent, or Firm—LaRiviere, Grubman & Payne, LLP

(57) ABSTRACT

A flash memory structure and its fabrication process, whereby stacks, of a first poly-crystalline silicon material or an amorphous silicon material (polysilicon), are processed for formation of a pre-interpoly dielectric treatment layer over the first polysilicon material. The pre-interpoly dielectric treatment layer being a solid material formed by a chemical reaction formed for purposes of improving the reliability of an interpoly dielectric member and results in changing the capacitor coupling ratio of the flash memory element and allows the use of new power supply and programming voltages. The pre-interpoly dielectric treatment layer is formed by exposing the polysilicon stacks to a selected one of at least three ambient reagent gases. The selected gaseous ambient and exposure of the polysilicon stacks being performed in a fabrication tool such as a batch furnace, a single wafer rapid thermal anneal tool, or a plasma chamber. The reagent gases consist essentially of: (1) nitrous oxide ($N_2O$) and/or nitric oxide (NO), (2) oxygen ($O_2$) and/or water ($H_2O$), and (3) ammonia ($NH_3$). Any one ambient reagent gas may be selected and utilized in any of the foregoing fabrication tools for pre-treating the surface of the first polysilicon stack prior to forming the interpoly dielectric structure member of the flash memory element. The interpoly dielectric member being a stack of silicon dioxide-silicon nitride-silicon dioxide material known as an ONO is thereon subsequently formed.

11 Claims, 2 Drawing Sheets

FLASH MEMORY HAVING PRE-INTERPOLY DIELECTRIC TREATMENT LAYER AND METHOD OF FORMING

RELATED APPLICATION

This application is related to co-pending U.S. Provisional Patent Application, Ser. No. 60/148,899, entitled "FLASH MEMORY HAVING PRE-INTERPOLY DIELECTRIC TREATMENT LAYER AND METHOD OF FORMING," filed Aug. 13, 1999, by the same Applicants.

TECHNICAL FIELD

The present invention relates to integrated circuits and fabrication techniques for forming interpoly dielectric stacks used in flash memory technology. More particularly, the present invention relates to integrated circuits and fabrication techniques for forming "ONO" interpoly dielectric stacks used in flash memory technology. Even more particularly, the present invention relates to integrated circuits and fabrication techniques for forming the bottom oxide layer of an "ONO" interpoly dielectric stack used in flash memory technology.

BACKGROUND OF THE INVENTION

The current state of the art in flash memory technology uses an interpoly dielectric stack typically consisting of the following layers: silicon dioxide (bottom), silicon nitride (middle), and silicon dioxide (top), known as an "ONO" (hereinafter referred to as ONO). The thickness of the ONO stack ranges from 100 Å to 300 Å, assuming a dielectric constant of 3.7 for the entire dielectric stack. The top oxide layer of the ONO stack is typically formed by thermal growth in an ambient steam. The middle nitride layer of the ONO stack is typically thinned during the formation of the top oxide layer. The bottom oxide layer of the ONO stack is exposed to the conditions arising from the formation of these two upper layers of the ONO stack. Accordingly, the electrical integrity of the bottom oxide layer is extremely critical to device performance. The thinning action acting on the previously formed oxide or nitride layer of the ONO stack introduces a problem: unreliable thickness determination of the completed ONO stack.

While U.S. Pat. Nos. 5,166,904 and 4,758,986 disclose texture asperities and roughness on polysilicon surfaces for the purpose of creating asymmetry in the structure to affect the electron tunneling and the magnitude of the tunneling threshold voltage, to Applicants' knowledge, no known flash memory fabrication process exists for forming nor flash memory structure exists having a polysilicon layer treated to form a protective layer prior to formation of the interpoly dielectric stack such that the subsequently formed interpoly dielectric stack's characteristics are optimized and improved, notwithstanding any adverse thinning action caused by the dielectric stack fabrication process. Further, no known flash memory fabrication process exists for forming nor flash memory structure exists, so formed, which both improves the reliability of the bottom oxide layer of an ONO interpoly dielectric stack and facilitates decreasing thickness of an ONO stack, thereby resulting in capacitor coupling ratio changes of the flash memory element and, therefore, allowing the use of new power supply and programming voltages.

BRIEF SUMMARY OF THE INVENTION

Accordingly, the present invention provides a flash memory structure having a polysilicon layer treated to form a protective layer prior to formation of the interpoly dielectric stack, such that the subsequently formed interpoly dielectric stack has optimized and improved characteristics, notwithstanding any adverse thinning action introduced by the subsequent dielectric stack fabrication process. The present invention also provides a fabrication process for forming a flash memory structure having a polysilicon layer treated to form a protective layer prior to formation of the interpoly dielectric stack, such that the subsequently formed interpoly dielectric stack has optimized and improved characteristics, notwithstanding any adverse thinning action caused by the dielectric stack fabrication process.

In particular, the flash memory structure of the present claimed invention is formed via a fabrication process, whereby stacks, of a first poly-crystalline silicon material or an amorphous silicon material being formed and processed to have an underlying thin film of silicon dioxide (i.e., at a partially formed stage of a memory element), are further processed to form a "pre-interpoly dielectric treatment layer," in accordance with the teachings of the present claimed invention. The treatment layer is hereinafter termed a pre-interpoly dielectric treatment layer to distinguish it from a post-treatment layer taught in Applicants' co-pending related U.S. patent application, Ser. No. 60,148,946, entitled "FLASH MEMORY HAVING A TREATMENT LAYER INTERPOSED BETWEEN AN INTERPOLY DIELECTRIC AND METHOD OF FORMING," referenced by Assignee's internal number D928, and hereby incorporated by reference.

This pre-interpoly dielectric treatment layer, in accordance with the present invention, involves exposing the polysilicon stacks to a selected ambient reagent gas of at least three ambient reagent gases. The selected ambient reagent gases and exposure of the polysilicon stacks to such selected ambient reagent gases is performed in a fabrication tool such as a batch furnace, a single wafer rapid thermal anneal tool, or a plasma chamber. The at least three ambient reagent gases are grouped in an ambient reagent gas group consisting essentially of: (1) nitrous oxide ($N_2O$) and/or nitric oxide (NO), (2) oxygen ($O_2$) and/or water ($H_2O$), and (3) ammonia ($NH_3$). Any one ambient reagent gas may be selected and utilized in any of the foregoing fabrication tools for pre-treating the surface of the first polysilicon stack prior to forming the interpoly dielectric structure member of the flash memory element. Other features of the present invention are disclosed, or are apparent in the section entitled "DETAILED DESCRIPTION OF THE INVENTION."

Reference numbers refer to the same or equivalent parts of the present invention throughout the several figures of the drawings.

DETAILED DESCRIPTION OF THE INVENTION

Figure 1:
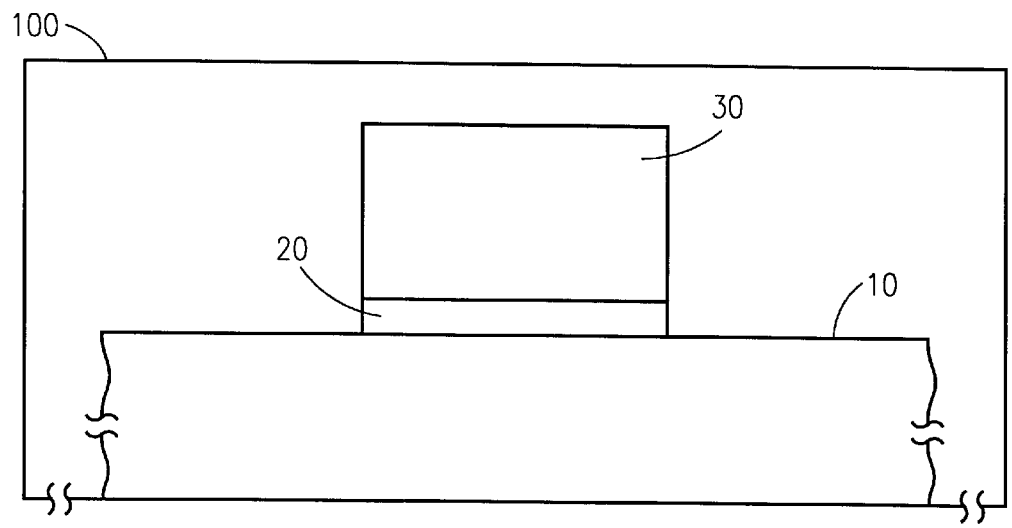
FIG. 1 is a cross-sectional view of a flash memory semiconductor substrate at a fabrication stage having various memory regions formed to a first polysilicon stack prior to formation of an interpoly dielectric layer, such flash memory semiconductor substrate for further processing, in accordance with the present invention.
Figure 2:
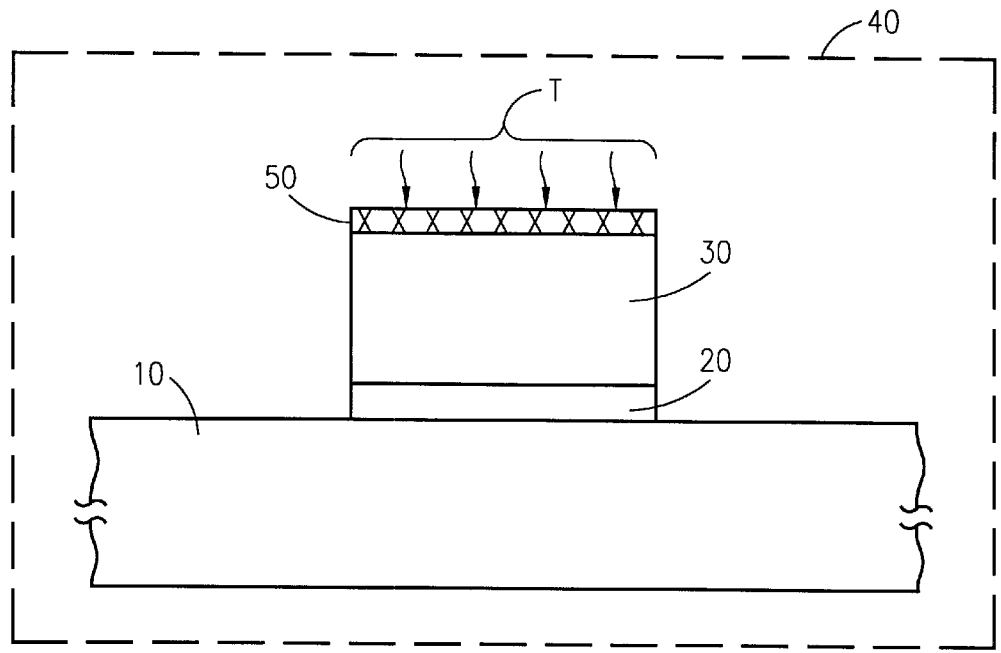
FIG. 2 is a cross-sectional view of the flash memory semiconductor substrate, depicted in FIG. 1, in a representative chamber of a fabrication tool for performing a pre-treatment step and subsequent formation of a pre-interpoly dielectric treatment layer on a surface of the first polysilicon stack, in accordance with the present invention.
Figure 4:
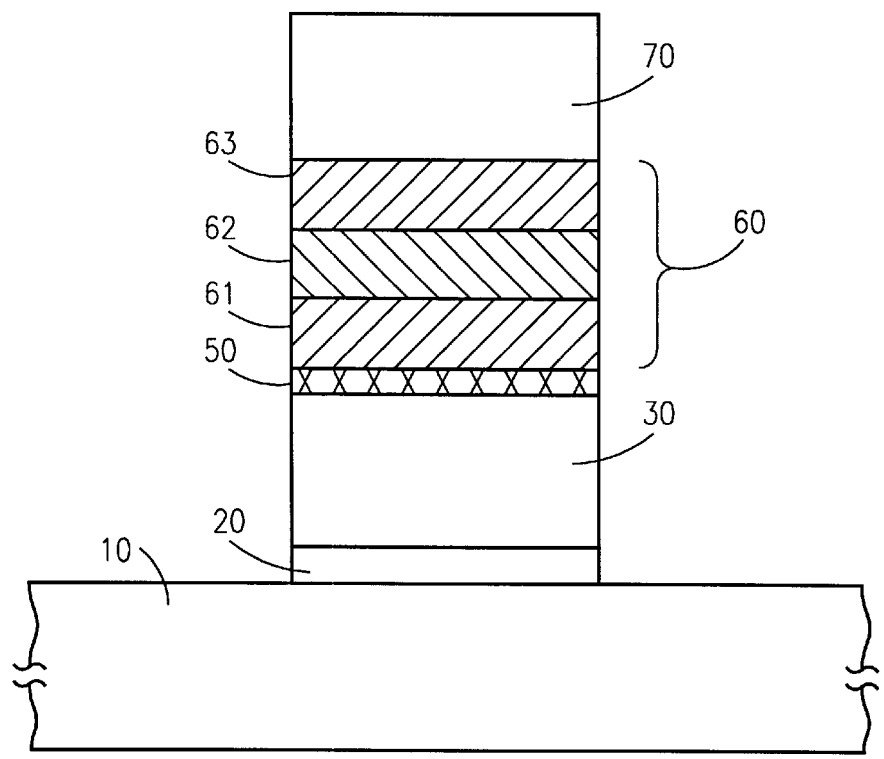
FIG. 4 is a cross-sectional view of the flash memory semiconductor substrate, depicted in FIG. 3, at a fabrication stage wherein the ONO interpoly dielectric stack has been formed and a second polysilicon layer has been subsequently formed over the ONO interpoly dielectric stack, in accordance with the present invention.

FIG. 1 is a cross-section of a semiconductor substrate 10 shown at an early fabrication stage for forming a flash memory device, shown generally by the numeral 100. As depicted, substrate 10 has a silicon dioxide layer 20 and a first polysilicon layer 30 formed to a stage for forming an interpoly dielectric layer, by example an ONO stack 60 as shown in FIG. 4, for being used in fabrication of a flash memory element member of flash memory device 100. Instead of forming the interpoly dielectric layer (e.g., ONO interpoly dielectric layer 60 at this stage of fabrication), as would be done by prior art processes, the polysilicon stack of the present claimed invention undergoes a fabrication step, shown generally as treatment step T shown in FIG. 2, in a fabrication chamber 40, for formation of a pre-interpoly dielectric treatment layer 50. A pre-interpoly dielectric treatment layer 50 improves the reliability of the subsequently formed interpoly dielectric layer, by example, an ONO stack-layer 60. By having the pre-interpoly dielectric treatment layer on the polysilicon surface, any tinning action occurring during formation of the ONO interpoly dielectric layer is withstood by the bottom oxide layer of the ONO stack. The thinning action is deemed beneficial to the performance of the completed flash memory element, because the capacitor coupling ratio of the flash memory element increases, which allows the use of lower power supply and programming voltages. By example, a decrease in ONO thickness of 5 to 30 Å would result in increasing the capacitor coupling ratio from 5 to 10% and a lowering of the power supply programming voltage by 2 to 10%. Treatment T can be performed in any one of three ambient reagent gas environments such as (1) nitrous oxide ($N_2O$) and/or nitric oxide (NO), (2) oxygen ($O_2$) and/or water ($H_2O$), and (3) ammonia ($NH_3$). Additionally, the treatment is performable in a fabrication tool such as a batch furnace, a single wafer rapid thermal anneal (RTA) chamber, or in a plasma chamber. Examples of the setups required for each ambient reagent gas in a particular fabrication tools are as follows:

EXAMPLE 1

Ambient $N_2O$ and/or NO a. The treatment T of a first polysilicon stack 30 in a batch furnace 40 comprises performing the process at an elevated temperature ranging from 800° C. to 1050° C. for a duration ranging from one (1) minute to two (2) hours in a gas mixture of at least one ambient reagent gas selected from a group of reagent gases consisting essentially of nitric oxide (NO) and nitrous oxide ($N_2O$), in a concentration ranging from 5 to 100 volume %, and at least one diluent gas selected from a group of diluent gases consisting essentially of argon (Ar), nitrogen ($N_2$), and oxygen ($O_2$), in a concentration balancing that of the selected at least one reagent gas, at a pressure ranging from 0.1 to 10.0 atmospheres;

b. The treatment T of a first polysilicon stack 30 in a single wafer RTA tool 40 comprises performing the process at an elevated temperature ranging from 700° C. to 1150° C. for a duration ranging from one (1) second to two (2) minutes in a gas mixture of at least one ambient reagent gas selected from a group of reagent gases consisting essentially of nitric oxide (NO) and nitrous oxide ($N_2O$), in a concentration ranging from 1 to 100 volume %, and at least one diluent gas selected from a group of diluent gases consisting essentially of argon (Ar), nitrogen ($N_2$), and oxygen ($O_2$), in a concentration balancing that of the selected at least one reagent gas; or c. The plasma treatment T of the surface of polysilicon 30 of in plasma chamber 40 would be performed in at least one ambient reagent gas selected from a group of reagent gases consisting essentially of a nitrogen ($N_2$) plasma and a nitrous oxide ($N_2O$) plasma for a duration ranging from one (1) second to two (2) minutes.

EXAMPLE 2

Ambient $O_2$ and/or $H_2O$ a. The treatment T of a first polysilicon stack 30 in a batch furnace 40 comprises performing the process at an elevated temperature ranging from 800° C. to 1050° C. for a duration ranging one (1) minute to sixty (60) minutes in a gas mixture of at least one ambient reagent gas selected from a group of reagent gases consisting essentially of oxygen ($O_2$) and water ($H_2O$), in a concentration ranging from 5 to 100 volume %, and at least one diluent gas selected from a group of diluent gases consisting essentially of argon (Ar) and nitrogen ($N_2$), in a concentration balancing that of the selected at least one reagent gas, at a pressure ranging from 0.5 to 10.0 atmospheres;

b. The treatment T of a first polysilicon stack 30 in a single wafer RTA tool 40 comprises performing the process at an elevated temperature ranging from 700° C. to 1150° C., for a duration ranging from one (1) second to one hundred twenty (120) seconds, in a gas mixture of at least one ambient reagent gas selected from a group of reagent gases consisting essentially of oxygen ($O_2$) and water ($H_2O$), in a concentration ranging from 1 to 100 volume %, and at least one diluent gas selected from a group of diluent gases consisting essentially of argon (Ar) and nitrogen ($N_2$), in a concentration balancing that of the selected at least one reagent gas; or c. The plasma treatment T of the surface of polysilicon 30 of in plasma chamber 40 would be performed in at least one ambient reagent gas selected from a group of reagent gases consisting essentially of an oxygen ($O_2$) plasma and a water ($H_2O$) plasma for a duration ranging from one (1) second to two (2) minutes.

EXAMPLE 3

Ambient $NH_3$ a. The treatment T of a first polysilicon stack 30 in a batch furnace 40 comprises performing the process at an elevated temperature ranging from 800° C. to 1050° C. for a duration ranging from one (1) minute to one hundred twenty (120) minutes in a gas mixture of ambient reagent gas ammonia ($NH_3$), in a concentration ranging from 5 to 100 volume %, and at least one diluent gas selected from a group of diluent gases consisting essentially of argon (Ar) and nitrogen ($N_2$), in a concentration balancing that of the selected at least one reagent gas, at a pressure ranging from 0.5 to 10.0 atmospheres;

b. The treatment T of a first polysilicon stack 30 in a single wafer RTA tool 40 comprises performing the process at an elevated temperature ranging from 700° C. to 1150° C. for a duration ranging from one (1) second to one hundred twenty (120) seconds in an ambient reagent gas ammonia ($NH_3$), in a concentration ranging from 1 to 100 volume %, and at least one diluent gas selected from a group of diluent gases consisting essentially of argon (Ar) and nitrogen ($N_2$), in a concentration balancing that of the selected at least one reagent gas; or c. The plasma treatment T of the surface of polysilicon 30 of in plasma chamber 40 would be performed in an ammonia ($NH_3$) plasma for a duration ranging from one (1) second to two (2) minutes.

Figure 3:
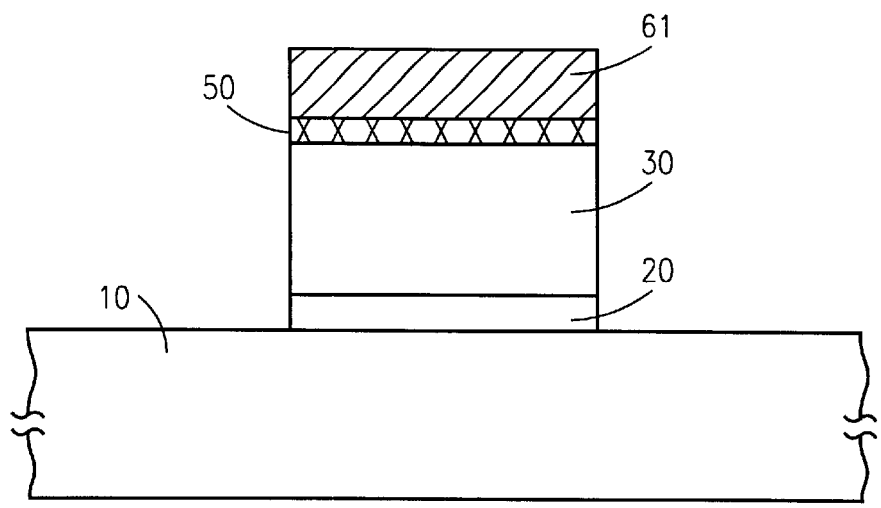
FIG. 3 is a cross-sectional view of the flash memory semiconductor substrate, depicted in FIG. 2, at a fabrication stage wherein the pre-interpoly dielectric treatment layer has been formed and is then utilized for subsequently forming a bottom oxide layer of an ONO interpoly dielectric stack, in accordance with the present invention.

Any one of the foregoing treatment examples of a polysilicon stack 30 will result in formation of a pre-interpoly dielectric treatment layer 50. After the fabrication of the pre-interpoly treatment layer 50 in the fabrication chamber 40, and as shown in the preferred embodiment in FIG. 3, a bottom oxide layer ($SiO_2$) 61 of ONO stack 60 is then formed over the pre-interpoly treatment layer 50. The bottom oxide layer 61 is then formed by reaction of $SiH_4$, or $SiCl_2$, and $N_2O$. As shown in FIG. 4, the fabrication of the middle nitride layer 62 and top oxide layer 63 of the ONO stack 60 are completed. Subsequently, a second polysilicon layer 70 is formed as part of the process required for completion of the flash memory element, using techniques well known in the industry.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims. Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. 112, sixth paragraph, unless the element is expressly recited using the phrase "means for."

What is claimed:

1. A flash memory semiconductor apparatus, said apparatus comprising:

a. a semiconductor substrate;

b. at least one region on said substrate member having a silicon dioxide layer;

c. a silicon material deposited over said silicon dioxide layer, said silicon material and said silicon dioxide layer being formed into at least one partial stack portion of a flash memory element, said silicon material formed into said at least one stack portion comprising a first polysilicon layer of said flash memory element;

d. a pre-interpoly dielectric treatment layer, said pre-interpoly dielectric treatment layer being formed over said first polysilicon layer;

e. an interpoly dielectric member, said interpoly dielectric member being formed over said pre-interpoly dielectric treatment layer; and f. a second polysilicon layer, said second polysilicon layer being formed over said interpoly dielectric member and forming another fabricated stage of said flash memory element.

2. A flash memory semiconductor apparatus, as recited in claim 1, wherein:

a. said pre-interpoly dielectric treatment layer comprises a solid material produced from a chemical reaction in a batch furnace, said chemical reaction comprises treating said first polysilicon layer in said batch furnace at an elevated temperature ranging from 800° C. to 1050° C. for a duration ranging from one (1) minute to two (2) hours in a gas mixture, and b. said gas mixture comprising at least one reagent gas selected from a group of reagent gases consisting essentially of a nitric oxide (NO) and a nitrous oxide ($N_2O$), in a concentration ranging from 5 to 100 volume %, and at least one diluent gas selected from a group of diluent gases consisting essentially of argon (Ar), nitrogen ($N_2$), and oxygen ($O_2$), in a concentration balancing that of the selected at least one reagent gas, at a pressure ranging from 0.1 to 10.0 atmospheres.

3. A flash memory semiconductor apparatus, as recited in claim 1, wherein:

a. said pre-interpoly dielectric treatment layer comprises a solid material produced from a chemical reaction in a single wafer RTA tool, said chemical reaction comprises treating said first polysilicon layer in said RTA tool at an elevated temperature ranging from 700° C. to 1150° C. for a duration ranging from one (1) second to two (2) minutes in a gas mixture, and b. said gas mixture comprising at least one reagent gas selected from a group of reagent gases consisting essentially of nitric oxide (NO) and nitrous oxide ($N_2O$), in a concentration ranging from 1 to 100 volume %, and at least one diluent gas selected from a group of diluent gases consisting essentially of argon (Ar), nitrogen ($N_2$), and oxygen ($O_2$), in a concentration balancing that of the selected at least one reagent gas.

4. A flash memory semiconductor apparatus, as recited in claim 1, wherein: said pre-interpoly dielectric treatment layer comprises a solid material produced from a chemical reaction in a plasma chamber, said chemical reaction comprises treating a surface of said first polysilicon layer in a plasma for a duration ranging from one (1) second to two (2) minutes, said plasma being selected from a plasma group of reagent gases consisting essentially of nitric oxide (NO) plasma and nitrous oxide ($N_2O$) plasma.

5. A flash memory semiconductor apparatus, as recited in claim 1, wherein:

a. said pre-interpoly dielectric treatment layer comprises a solid material produced from a chemical reaction in a batch furnace, said chemical reaction comprises treating said first polysilicon layer in said batch furnace at an elevated temperature ranging from 800° C. to 1050° C. for a duration ranging from one (1) minute to sixty (60) minutes in a gas mixture, and b. said gas mixture comprising at least one reagent gas selected from a group of reagent gases consisting essentially of oxygen ($O_2$) and water ($H_2O$), in a concentration ranging from 5 to 100 volume %, and at least one diluent gas selected from a group of diluent gases consisting essentially of argon (Ar) and nitrogen ($N_2$), in a concentration balancing that of the selected at least one reagent gas, at a pressure ranging from 0.5 to 10.0 atmospheres.

6. A flash memory semiconductor apparatus, as recited in claim 1, wherein:

a. said pre-interpoly dielectric treatment layer comprises a solid material produced from a chemical reaction in a single wafer RTA tool, said chemical reaction comprises treating said first polysilicon layer in said RTA tool at an elevated temperature ranging from 700° C. to 1150° C. for a duration ranging from one (1) second to one hundred twenty seconds with a gas mixture, and b. said gas mixture comprising at least one ambient reagent gas selected from a group of reagent gases consisting essentially of oxygen ($O_2$) and water ($H_2O$), in a concentration ranging from 1 to 100 volume % and 0.5 to 80 volume percent, respectively, and at least one diluent gas selected from a group of diluent gases consisting essentially of argon (Ar) and nitrogen ($N_2$), in a concentration balancing that of the selected at least one reagent gas.

7. A flash memory semiconductor apparatus, as recited in claim 1, wherein:

a. said pre-interpoly dielectric treatment layer comprises a solid material produced from a chemical reaction in a batch furnace, said chemical reaction comprises treating said first polysilicon layer in said batch furnace at an elevated temperature ranging from 800° C. to 1050° C. for a duration ranging from one (1) minute to one hundred twenty (120) minutes in a gas mixture, and said gas mixture comprising a reagent gas, ammonia ($NH_3$), in a concentration ranging from 5 to 100 volume %, and at least one diluent gas selected from a group of diluent gases consisting essentially of argon (Ar) and nitrogen ($N_2$), in a concentration balancing that of the selected at least one reagent gas, at a pressure ranging from 0.5 to 10.0 atmospheres.

8. A flash memory semiconductor apparatus, as recited in claim 1, wherein:

a. said pre-interpoly dielectric treatment layer comprises a solid material produced from a chemical reaction in a single wafer RTA tool, said chemical reaction comprises treating said first polysilicon layer in said RTA tool at an elevated temperature ranging from 700° C. to 1150° C. for a duration ranging from one (1) second to one hundred twenty (120) seconds in a gas mixture, and b. said gas mixture comprising a reagent gas, ammonia ($NH_3$), in a concentration ranging from 5 to 100 volume %, and at least one diluent gas stream selected from a group of diluent gases consisting essentially of argon (Ar) and nitrogen ($N_2$), in a concentration balancing that of the selected at least one reagent gas.

9. A flash memory semiconductor apparatus, as recited in claim 1, wherein: said pre-interpoly dielectric treatment layer comprises a solid material produced from a chemical reaction in a plasma chamber, said chemical reaction comprises treating a surface of said first polysilicon layer in a reagent gas, ammonia ($NH_3$), plasma for a duration ranging from one (1) second to two (2) minutes.

10. A flash memory semiconductor apparatus, said apparatus comprising:

a. a semiconductor substrate;

b. at least one region on said substrate member having a silicon dioxide layer;

c. a silicon material deposited over said silicon dioxide layer, said silicon material and said silicon dioxide layer being formed into at least one partial stack portion of a flash memory element, said silicon material formed into said at least one stack portion comprising a first polysilicon layer of said flash memory element;

d. a pre-interpoly dielectric treatment layer, said pre-interpoly dielectric treatment layer being formed over said first polysilicon layer;

e. a multi-layered interpoly dielectric member of decreased thickness, said multi-layered interpoly dielectric member having a thickness decrease ranging from 5 to 30 Å for said dielectric member, for increasing a capacitor coupling ratio from 5% to 10% for coupling said flash memory semiconductor apparatus and lowering a power supply programming voltage for programming said flash memory semiconductor apparatus by 2 to 10%; and f. a second polysilicon layer, said second polysilicon layer being formed over said interpoly dielectric member and forming another fabricated stage of said flash memory element.

11. A flash memory semiconductor apparatus, as recited in claim 10 wherein: said multi-layered interpoly dielectric member comprises a. a top oxide layer of silicon dioxide;

b. a middle nitride layer of silicon nitride; and c. a bottom oxide layer of silicon dioxide, and said multi-layered interpoly dielectric member being known as an ONO.

* * * * *